US010068975B2

(12) United States Patent
Poelzl

(10) Patent No.: US 10,068,975 B2
(45) Date of Patent: Sep. 4, 2018

(54) SEMICONDUCTOR DEVICE HAVING FIELD PLATE STRUCTURES, SOURCE REGIONS AND GATE ELECTRODE STRUCTURES BETWEEN THE FIELD PLATE STRUCTURES

(71) Applicant: Infineon Technologies Austria AG, Villach (AT)

(72) Inventor: Martin Poelzl, Ossiach (AT)

(73) Assignee: Infineon Technologies Austria AG, Vilach (AT)

( * ) Notice: Subject to any disclaimer, the term of this patent is extended or adjusted under 35 U.S.C. 154(b) by 0 days.

(21) Appl. No.: 15/600,328

(22) Filed: May 19, 2017

(65) Prior Publication Data

US 2017/0256619 A1     Sep. 7, 2017

Related U.S. Application Data

(63) Continuation of application No. 14/993,624, filed on Jan. 12, 2016, now Pat. No. 9,691,862.

(30) Foreign Application Priority Data

Jan. 13, 2015   (DE) .................. 10 2015 100 390

(51) Int. Cl.
*H01L 29/66*     (2006.01)
*H01L 29/40*     (2006.01)
(Continued)

(52) U.S. Cl.
CPC ...... *H01L 29/404* (2013.01); *H01L 21/02636* (2013.01); *H01L 23/535* (2013.01);
(Continued)

(58) Field of Classification Search
CPC ............ H01L 29/404; H01L 21/02636; H01L 23/535; H01L 29/0657; H01L 29/0696;
(Continued)

(56) References Cited

U.S. PATENT DOCUMENTS 6,710,403 B2   3/2004   Sapp
6,750,508 B2   6/2004   Omura et al.
(Continued)

FOREIGN PATENT DOCUMENTS

DE   102012223663 A1   6/2013
EP         1044474 B1   3/2008

*Primary Examiner* — Vu A Vu
(74) *Attorney, Agent, or Firm* — Murphy, Bilak & Homiller, PLLC

(57) ABSTRACT

A semiconductor device includes a semiconductor substrate having a first surface, first and second field plate structures extending in a first direction parallel to the first surface, a plurality of gate electrode structures disposed over the first surface and extending in a second direction parallel to the first surface, the second direction being different than the first direction, and a plurality of source regions and drain regions of a first conductivity type arranged in an alternating manner at the first surface so that a drain region is disposed on one side of a gate electrode structure and a source region is disposed on the other side of the gate electrode structure. The gate electrode structures are disposed between the first and the second field plate structures. The source regions and the drain regions extend in parallel with one another along the second direction.

19 Claims, 14 Drawing Sheets

(51) Int. Cl.
  *H01L 21/02* (2006.01)
  *H01L 29/78* (2006.01)
  *H01L 29/417* (2006.01)
  *H01L 29/08* (2006.01)
  *H01L 29/06* (2006.01)
  *H01L 23/535* (2006.01)
  *H01L 29/10* (2006.01)
  *H01L 29/423* (2006.01)

(52) U.S. Cl.
  CPC ...... *H01L 29/0657* (2013.01); *H01L 29/0696* (2013.01); *H01L 29/0878* (2013.01); *H01L 29/0882* (2013.01); *H01L 29/1095* (2013.01); *H01L 29/407* (2013.01); *H01L 29/4175* (2013.01); *H01L 29/42368* (2013.01); *H01L 29/66681* (2013.01); *H01L 29/66712* (2013.01); *H01L 29/781* (2013.01); *H01L 29/7802* (2013.01); *H01L 29/7809* (2013.01); *H01L 29/7816* (2013.01); *H01L 29/7823* (2013.01); *H01L 29/0865* (2013.01); *H01L 2924/0002* (2013.01)

(58) Field of Classification Search
  CPC ............. H01L 29/0865; H01L 29/0882; H01L 29/1095; H01L 29/4175; H01L 29/66681; H01L 29/66712; H01L 29/781; H01L 29/7823
  USPC .......................................................... 257/329
  See application file for complete search history.

(56) References Cited

U.S. PATENT DOCUMENTS

| | | | |
|---|---|---|---|
| 7,514,743 B2 | 4/2009 | Yang | |
| 7,595,523 B2* | 9/2009 | Parthasarathy | H01L 29/0696 257/302 |
| 8,344,451 B2* | 1/2013 | Darwish | H01L 29/0634 257/329 |
| 8,541,837 B2* | 9/2013 | Hirler | H01L 29/0834 257/331 |
| 8,754,497 B2* | 6/2014 | Denison | H01L 29/0653 257/492 |
| 8,928,075 B2* | 1/2015 | Kocon | H01L 27/088 257/337 |
| 2006/0267044 A1 | 11/2006 | Yang | |

\* cited by examiner

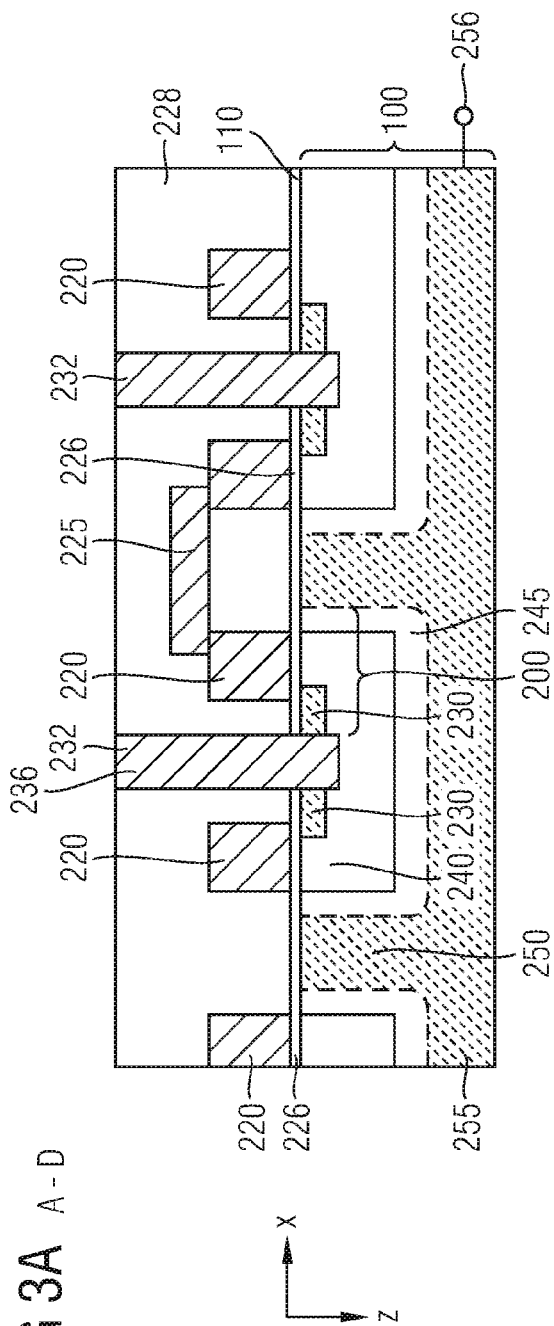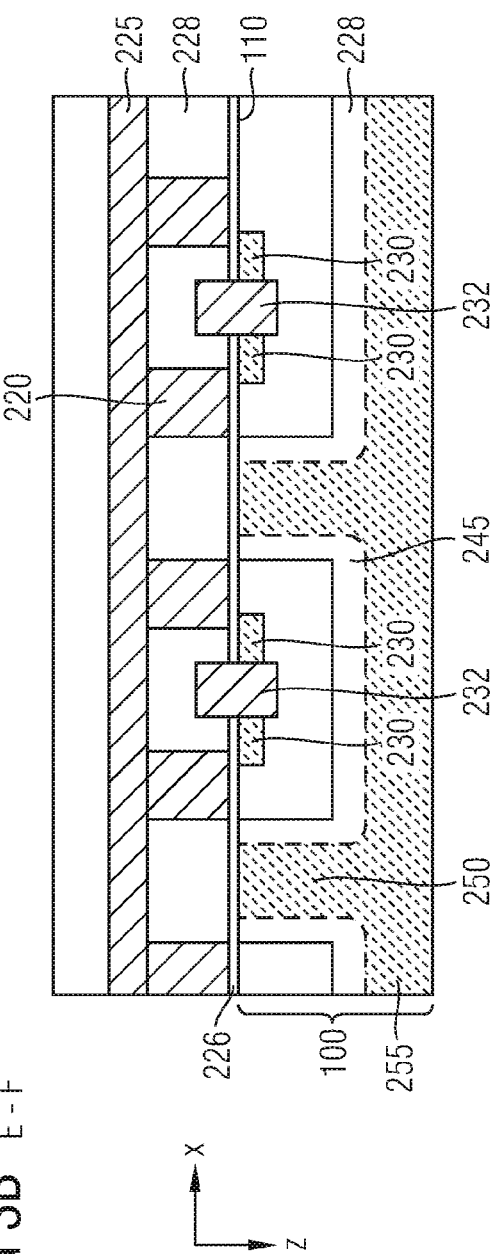

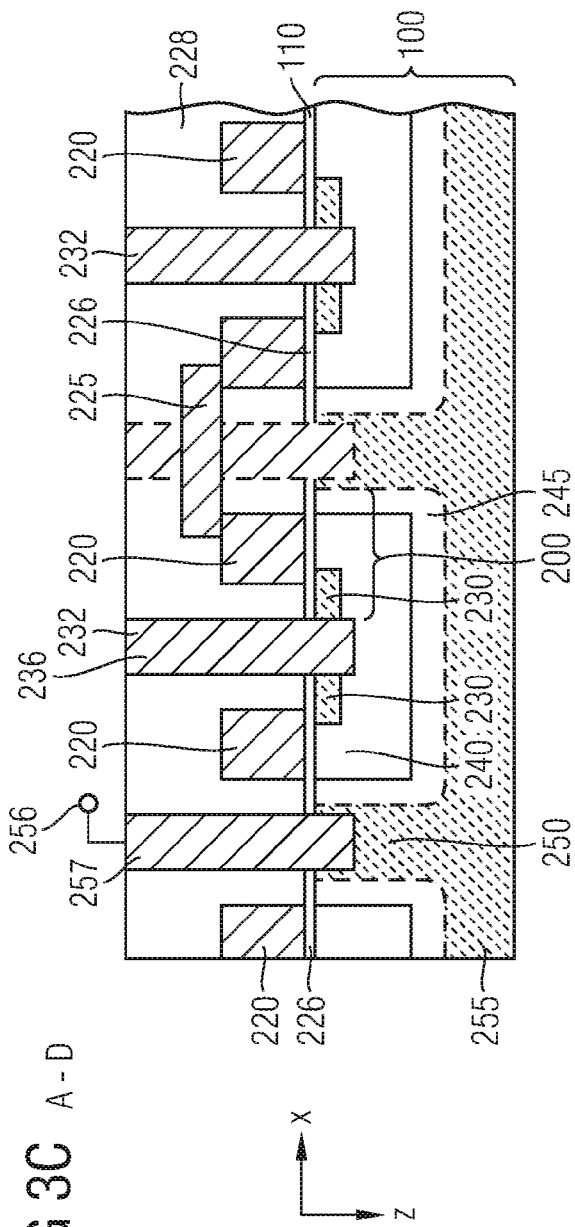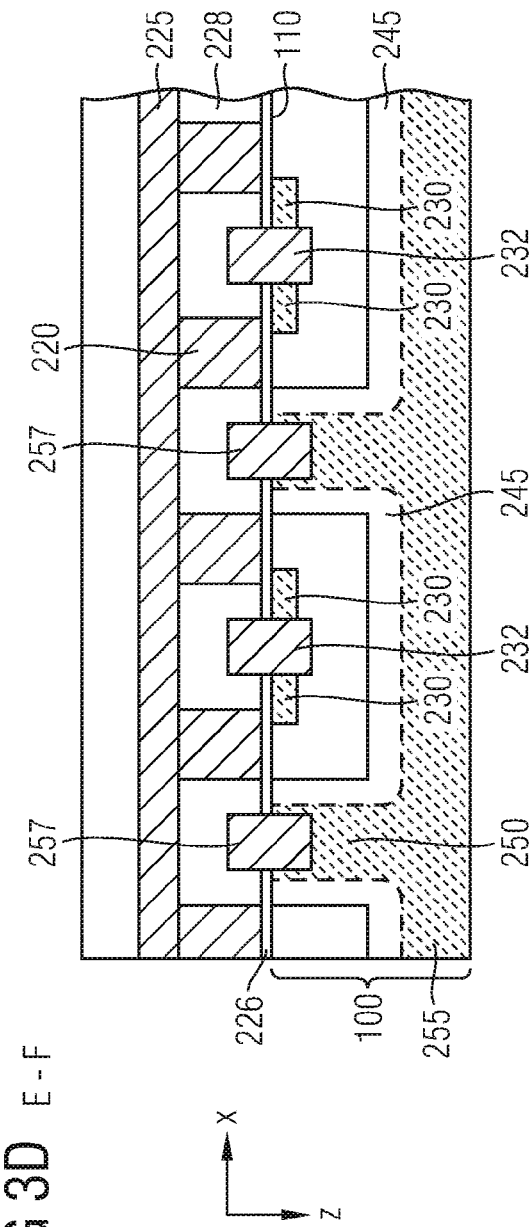

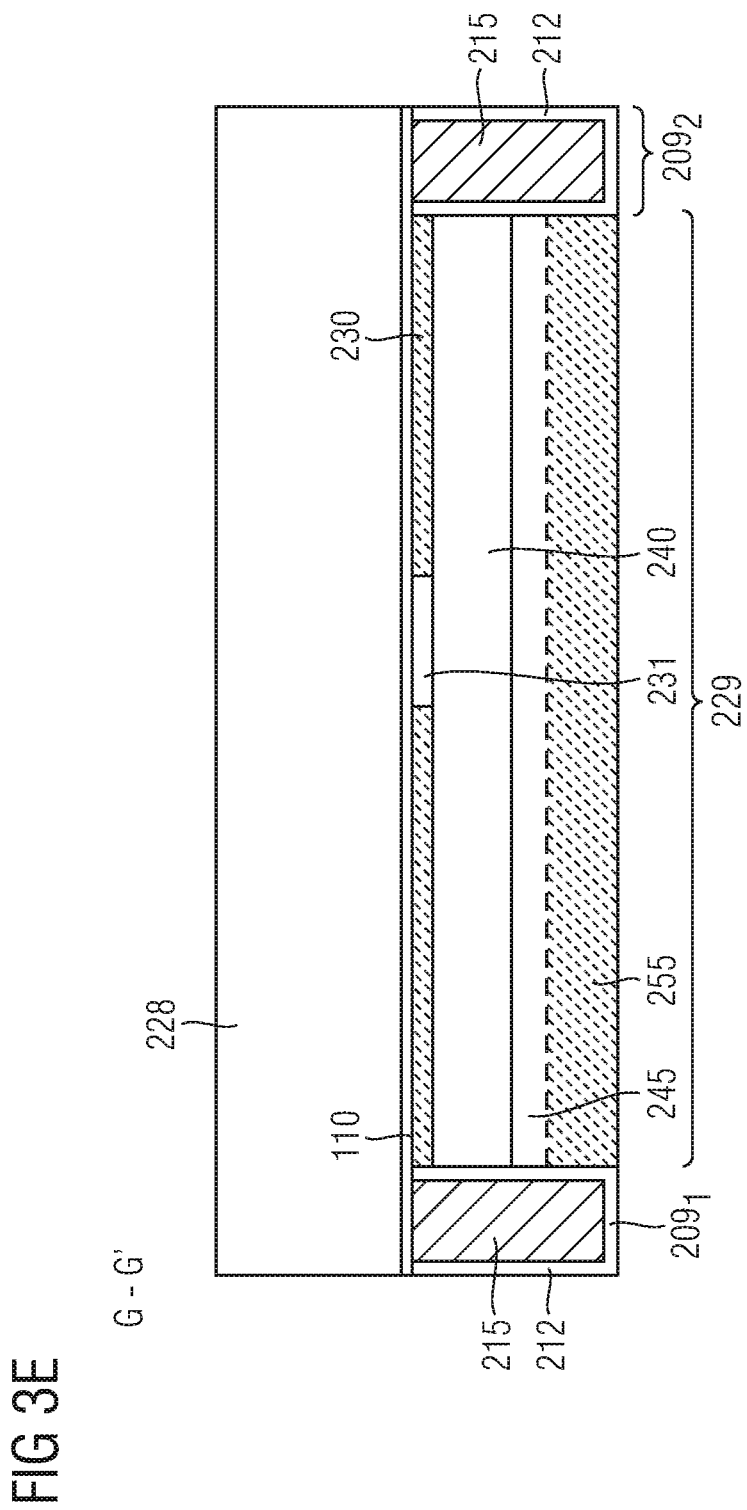

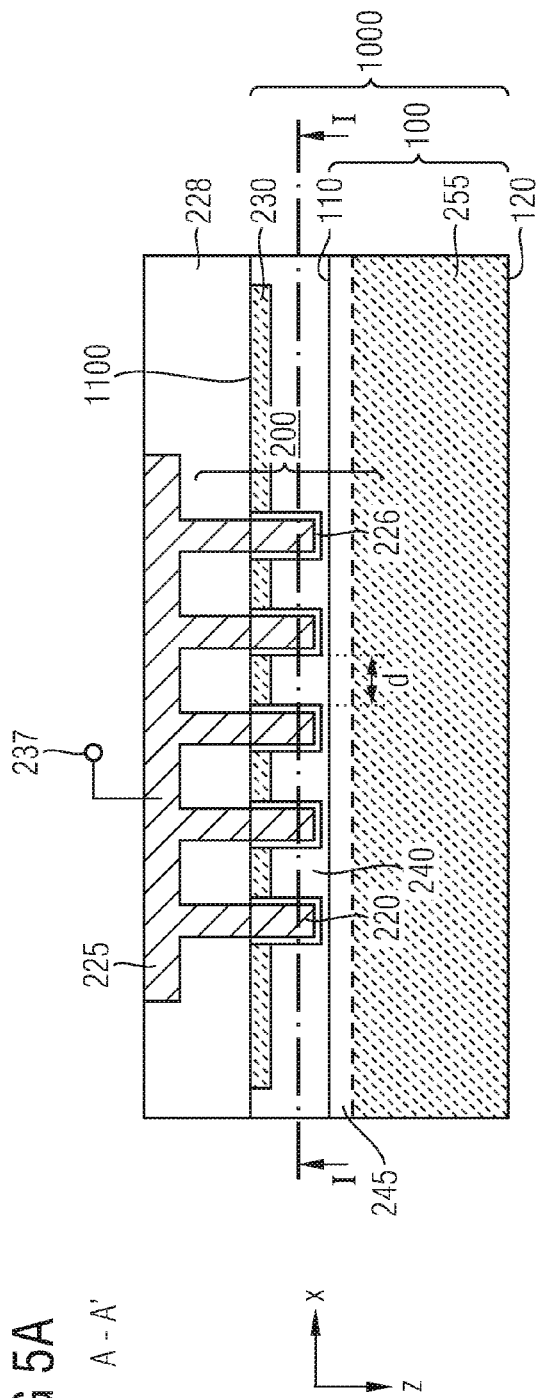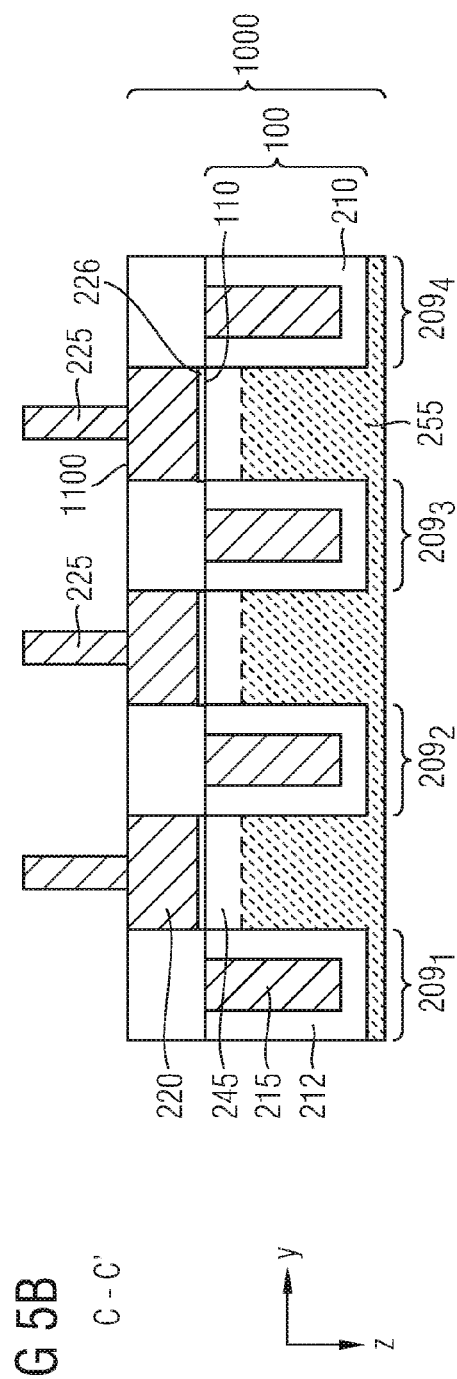

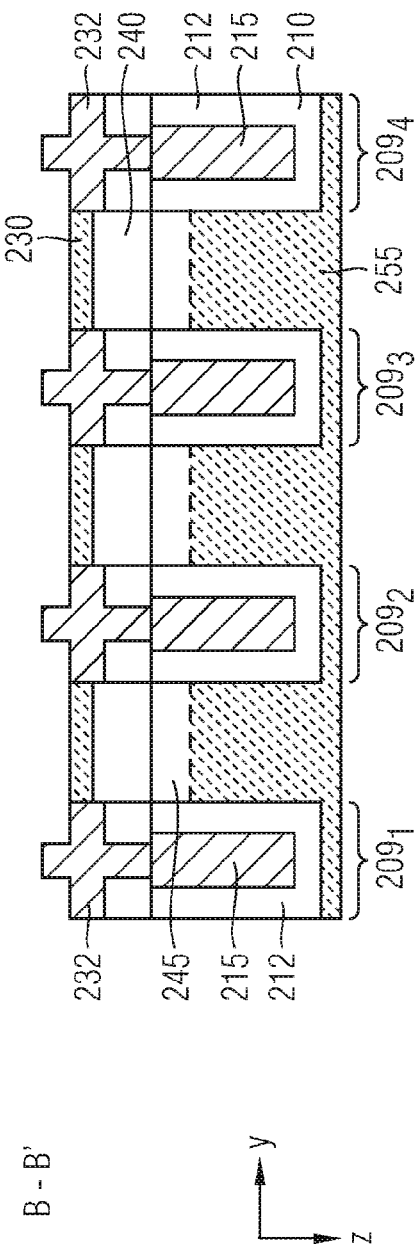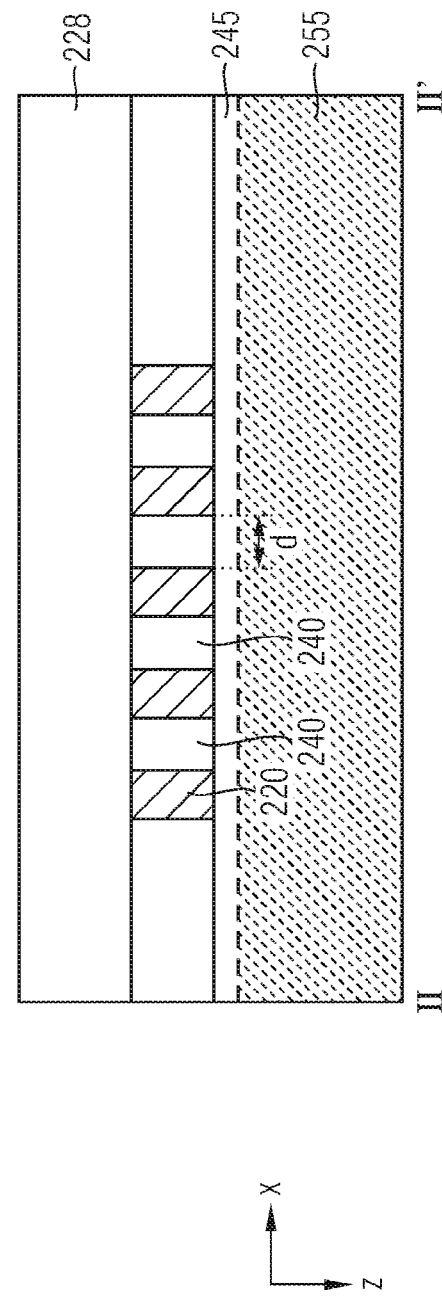

SEMICONDUCTOR DEVICE HAVING FIELD PLATE STRUCTURES, SOURCE REGIONS AND GATE ELECTRODE STRUCTURES BETWEEN THE FIELD PLATE STRUCTURES

PRIORITY CLAIM

This application is a Continuation of U.S. application Ser. No. 14/993,624 filed on 12 Jan. 2016, which in turn claims priority to German Patent Application No. 10 2015 100 390.2 on 13 Jan. 2015, the content of both of said applications incorporated herein by reference in their entirety.

BACKGROUND

Power transistors commonly employed in automotive and industrial electronics require a low on-state resistance ($R_{on}$), while securing a high voltage blocking capability. Power transistors may be employed as switching elements in a variety of circuits, e.g. in converter circuits. In order to meet the demands of such converter circuits, the transistors should be able to be switched at high frequencies and at low charge and conduction losses. Hence, attempts are made to improve the performance of power transistors, in order to improve the efficiency of circuits. It is an object of the present invention to improve the performance of a transistor.

SUMMARY

According to an embodiment, a semiconductor device comprises a field effect transistor in a semiconductor substrate having a first surface. The field effect transistor comprises a first field plate structure and a second field plate structure, each extending in a first direction parallel to the first surface, and gate electrode structures disposed over the first surface and extending in a second direction parallel to the first surface. The gate electrode structures are disposed between the first and the second field plate structures.

According to a further embodiment, a semiconductor device comprises a field effect transistor formed in a semiconductor substrate having a first surface. The field effect transistor comprises first and second field plate structures extending in a first direction parallel to the first surface. The first field plate structure is arranged in a first field plate trench formed in the first surface, and the second field plate structure is arranged in a second field plate trench formed in the first surface. The field effect transistor further comprises gate electrode structures and body regions, extending between the first and the second field plate trenches. The gate electrode structures and the body regions are arranged in an alternating manner along the first direction.

According to an embodiment, a method of manufacturing a semiconductor device comprising a field effect transistor in a semiconductor substrate having a first surface comprises forming first and second field plate structures extending in a first direction parallel to the first surface, the first field plate structure being arranged in a first plate trench formed in the first surface and the second field plate structure being arranged in a second plate trench formed in the first surface. The method further comprises forming gate electrode structures and body regions extending between the first and the second field plate trenches, wherein the gate electrode structures and the body regions are arranged in an alternating manner along the first direction.

According to an embodiment, an electric circuit comprises a semiconductor device as defined above. According to an embodiment, the electric circuit may be a buck converter.

According to an embodiment, a power supply may comprise such an electric circuit.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIGS. 3A to 3F illustrate cross-sectional views of a semiconductor device according to an embodiment.

FIGS. 5A to 5D illustrate cross-sectional views of a semiconductor device according to a further embodiment.

DETAILED DESCRIPTION

Figure 1:
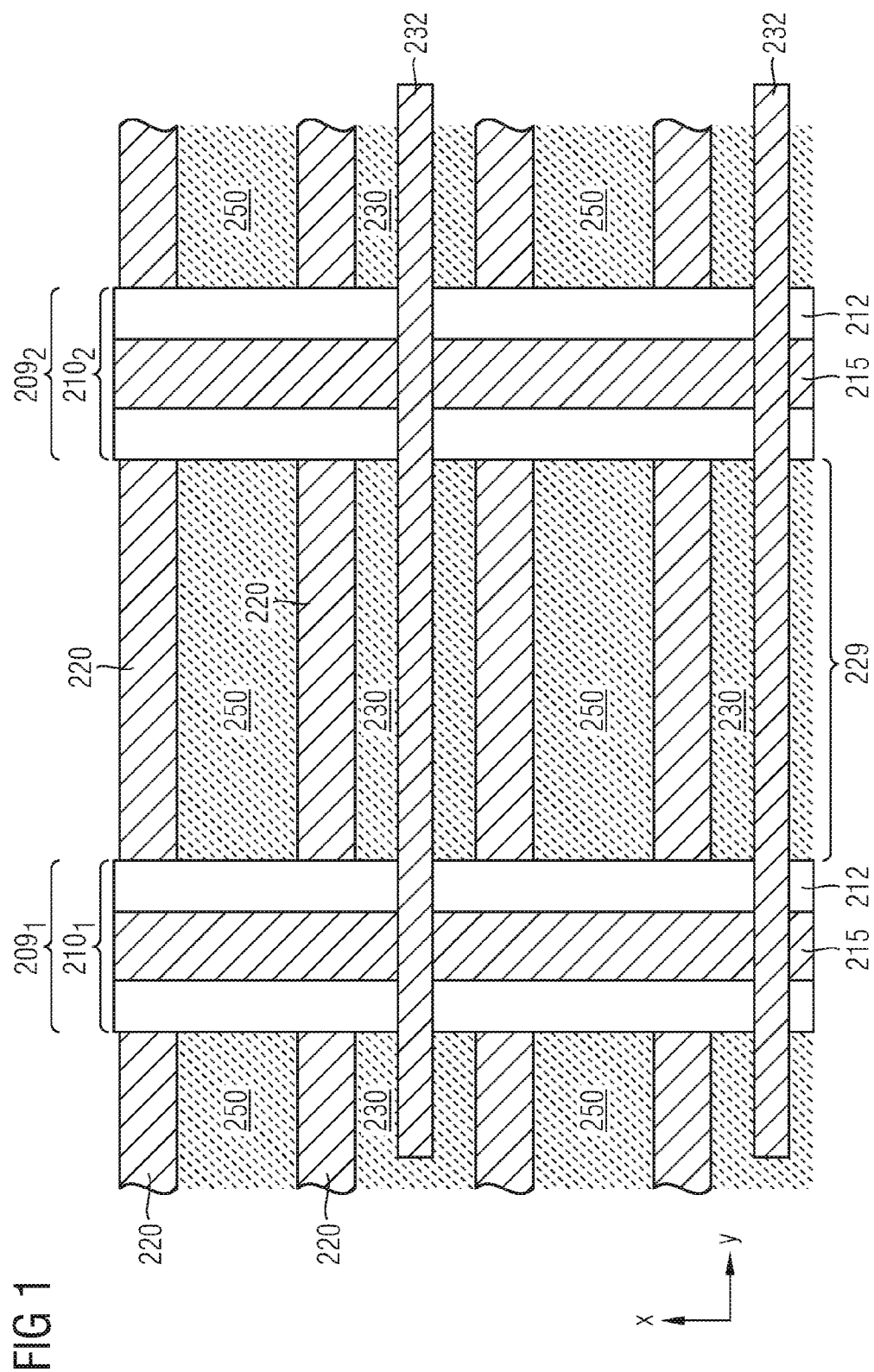
FIG. 1 shows a schematic plan view of a semiconductor device according to an embodiment.

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

The Figures and the description illustrate relative doping concentrations by indicating "−" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

The present specification refers to a "first" and a "second" conductivity type of dopants, semiconductor portions are doped with. The first conductivity type may be p type and the second conductivity type may be n type or vice versa. As is generally known, depending on the doping type or the polarity of the source and drain regions, insulated gate field effect transistors (IGFETs) such as metal oxide semiconductor field effect transistors (MOSFETs) may be n-channel or p-channel MOSFETs. For example, in an n-channel MOSFET, the source and the drain region are doped with n-type dopants, and the current direction is from the drain region to the source region. In a p-channel MOSFET, the source and the drain region are doped with p-type dopants, and the current direction is from the source region to the drain region. As is to be clearly understood, within the context of the present specification, the doping types may be reversed. If a specific current path is described using directional language, this description is to be merely understood to indicate the path and not the polarity of the current flow, i.e. whether the transistor is a p-channel or an n-channel transistor. The Figures may include polarity-sensitive components, e.g. diodes. As is to be clearly understood, the specific arrangement of these polarity-sensitive components is given as an example and may be inverted in order to achieve the described functionality, depending whether the first conductivity type means n-type or p-type.

The terms "lateral" and "horizontal" as used in this specification intends to describe an orientation parallel to a first surface of a semiconductor substrate or semiconductor body. This can be for instance the surface of a wafer or a die.

The term "vertical" as used an this specification intends to describe an orientation which is arranged perpendicular to the first surface of the semiconductor substrate or semiconductor body.

The present specification generally refers to "field plate structures" which are shown as continuous lines. According to embodiments, the field plate structures may also comprise segmented field plates which comprise a plurality of segments which are electrically connected to each other.

FIG. 1 shows a schematic plan view of a semiconductor device according to an embodiment. The semiconductor device comprises a field effect transistor in a semiconductor substrate having a surface, as will be further illustrated with reference to FIGS. 3A to 3F. The field effect transistor includes a first field plate structure $210_1$ and a second field plate structure $210_2$, each extending in a first direction (x direction.) A mesa 229 is defined between adjacent field plate structures $210_1$, $210_2$. The semiconductor device further comprises gate electrode structures 220 that run in a second direction (y direction). The gate electrode structures 220 are disposed between the first and the second field plate structures $210_1$, $210_2$. As will be shown in FIGS. 3A to 3F, the gate electrode structures are disposed over the first surface. Source regions 230 and drain regions 250 are disposed between adjacent gate electrode structures 220. The source regions 230 and the drain regions 250 are arranged in an alternating manner so that a drain region 250 is disposed on one side of a gate structure 220 and a source region 230 is disposed on the other side of the gate structure 220.

The semiconductor device may further comprise a source contact line 232 which electrically connects the source regions 230 to a source terminal. As illustrated in FIG. 1, the source contact line 232 may extend in the second direction. For example, the source contact line 232 may run over the semiconductor device and cross the field plate structures $210_1$, $210_2$. As is to be clearly understood, FIG. 1 only shows some transistor cells of a semiconductor device. The semiconductor device generally comprises a plurality of adjacent field plate structures 210 in the manner illustrated in FIG. 1 as well as a plurality of gate electrode structures 220 disposed between adjacent field plate structures. According to an embodiment, the plurality of transistor cells are connected in parallel.

Figure 2A:
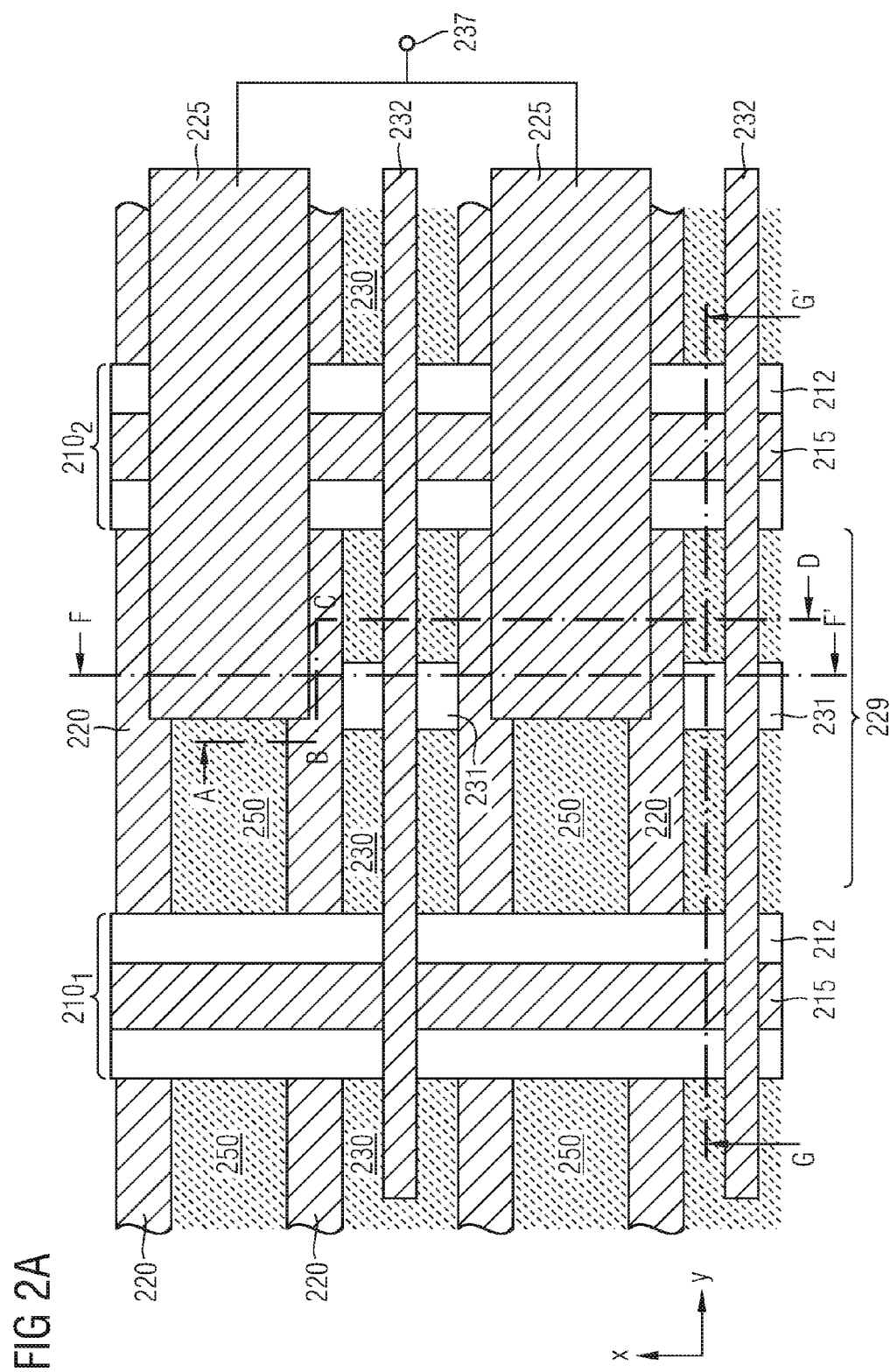
FIGS. 2A and 2B illustrate diagrammatic plan views of semiconductor devices according to further embodiments.

FIG. 2A shows a plan view of the semiconductor device according to a further embodiment. In addition to the components illustrated in FIG. 1, the semiconductor device illustrated in FIG. 2A comprises gate contact portions 225 for electrically coupling the gate electrodes 220 to a gate terminal 237. According to the embodiment shown in FIG. 2A, the gate contact lines 225 extend in the second direction and the source contact line 232 extends in the second direction. The gate contact line 225 and the source contact line 232 may be disposed in different layers of the semiconductor device. According to an embodiment, a portion 231 adjacent to the source region 230 may not be doped to be of the first conductivity type. For example, this may be accomplished by using a suitable mask when defining the source region 230. Accordingly, some portions of the mesa 229 may not be provided with a source region 230. As a result, an active transistor may locally not be formed at this portion 231. Thereby, avalanche breakdown may be avoided.

Figure 2B:
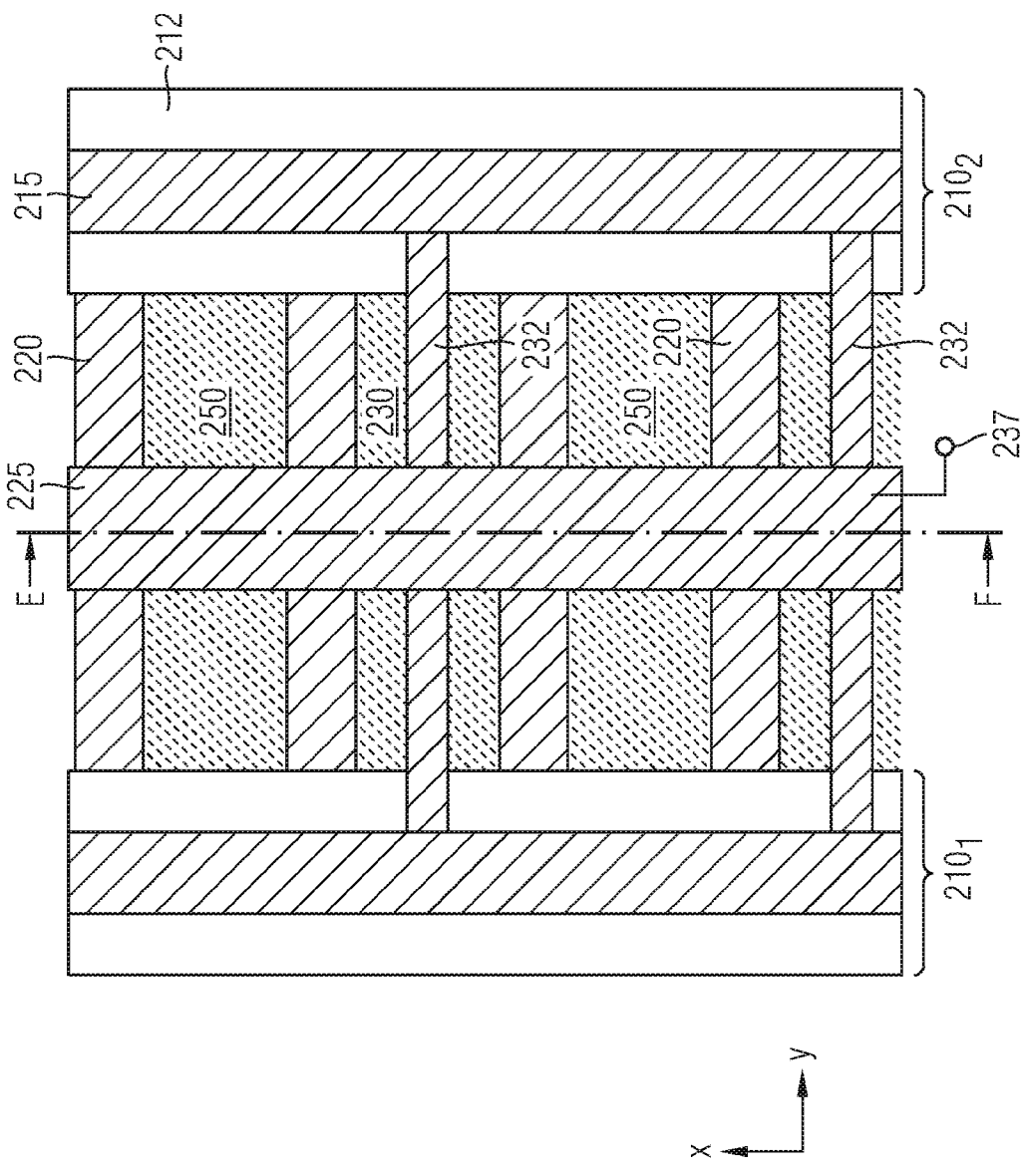

FIG. 2B shows an embodiment according to which the gate contact lines 225 extend in the first direction. The source contact line 232 extends in the second direction and the gate contact line 225 extends in the first direction. The gate contact line 225 and the source contact line 232 may be disposed in different layers of the semiconductor device. The embodiments shown in FIGS. 2A and 2B show similar components as those illustrated in FIG. 1.

FIG. 3A illustrates a cross-sectional view of the semiconductor device shown in FIG. 2A along the line A-D. In particular, the cross-sectional view of FIG. 3A is taken along the first direction so as to intersect portions comprising the gate contact line 225 and portions which do not include the gate contact line.

As is shown in FIG. 3A, the semiconductor device comprises a field effect transistor 200 in a semiconductor substrate 100 having a first surface 110. The first and the second directions, (e.g. x and y direction) run parallel to the first surface 110. The z direction extends in a depth direction of the substrate.

As is further illustrated in FIG. 3A, the semiconductor device further comprises a source region 230, a drain region 250, and a body region 240. The source region 230 and the drain region 250 are of the first conductivity type, the body region 240 is of the second conductivity type. The source region 230 and the drain region 250 are arranged at the first surface 110. The source region, the body region 240 and the drain region 250 are disposed along the first direction (e.g. the x direction). A drain contact region 255 may be disposed adjacent to the second surface 120 of the semiconductor substrate 100. The drain contact region 255 may be made of material which is identical to the drain region 250. According to an embodiment, a doping concentration of the drain contact region 255 may be different from a doping concentration of the drain region 250. The drain contact region 255 may be electrically connected to the drain region 250. A first load terminal (e.g. source terminal 236) may be electrically connected to the source region 230. A second load terminal (e.g. drain terminal 256) may be electrically connected to the drain contact region 255.

The gate electrode 220 is adjacent to the body region 240, wherein a gate insulating layer 226 is disposed between the body region 240 and the gate electrode 220. When a suitable voltage is applied to the gate electrode 220, a conductive inversion layer (channel region) is formed at the boundary between the body region 240 and the gate insulating layer 226. As a result, the transistor is in a conducting state from the first load terminal via the source region 230, the body region 240 and the drain region 250 to a second load terminal. Accordingly, in the context of the present specification, any doped portion of the first conductivity type, that may be connected to a second load terminal to enable a current flow between the first load terminal and the second load terminal may be understood as representing a drain region 250.

The semiconductor device may further comprise a drift zone or drain extension region 245 that forms part of the drain region 250. The drift zone 245 may be disposed adjacent to the body region 240 and. The drift zone 245 may further form part of the drain contact portion 255 and may be disposed adjacent to the body region. The semiconductor device illustrated in FIG. 3A comprises a lateral transistor. In more detail, the gate electrode is configured to control a current flowing in a direction parallel to the first surface 110. The gate electrode 220 is disposed over the first surface 110. According to an embodiment, the semiconductor device may implement a horizontal device comprising a first load terminal 236 at a side of the first surface 110 of the semiconductor substrate and a second load terminal 256 at a side of the second surface 120 of the semiconductor substrate 100. According to a further embodiment (not illustrated), the drain region 250 may be contacted via a contact at the first surface 110.

According to the embodiment illustrated in FIG. 3A, the to contact lines 225 run in the second direction (y direction). Further, the source contact lines 232 run in the second direction (y direction).

According to the embodiment illustrated in FIG. 3B, the gate contact lines run in the first direction (x direction). The source contact lines 232 run in the second direction. The further components of the semiconductor device illustrated in FIG. 3B are similar to those illustrated in FIG. 3A. The cross-sectional views of FIGS. 3A and 3B are taken between adjacent field plates.

When the transistor shown in FIGS. 3A and 3B is switched on, a conductive inversion layer is formed at the boundary between the body region and the gate insulating layer 226. Accordingly, the transistor is in a conducting state from the source region 220 to the drain region 250 via the drift zone 245. In case of switching-off, no conductive inversion layer is formed at the boundary between the body region 240 and the gate insulating layer 226. Moreover, due to the presence of the field plate structures 210₁, 201₂ compensation of the charge carriers in the drift zone 245 is accomplished. Since the field plates 215 are disposed in field plate trenches, charge compensation may be accomplished along the depth of the drift zone 245. As a consequence, the doping concentration of the body region 240 may be increased without deteriorating the blocking characteristics of the transistor, thereby reducing the on-state resistance ($R_{on}$×A) of the transistor. On the other side, since the source region 230 and the drain region 250 are disposed adjacent to the first surface 110 of the transistor, the overlap between body region 240 and the drift zone 245 may be exactly adjusted at the surface region. Further, the overlap between gate electrode and body region may be exactly adjusted. As a consequence, the performance of the transistor may be improved.

According to a further embodiment which is illustrated in FIGS. 3C and 3D, a drain contact 257 may be disposed at the first main surface 110 of the semiconductor substrate 100. The drain contact 257 may electrically connect the drain region 250 to a drain terminal 256. As is illustrated in FIG. 3C, the drain contact 257 may be disposed before or behind the drawing plane between C and D as illustrated in FIG. 2A. The cross-sectional view between A and B may intersect the drain contact 257. As is illustrated in FIG. 3D, the drain contact 257 that is adjacent to the first main surface 110 of the substrate may be implemented in a similar manner as the source contact line.

FIG. 3E shows a cross-sectional view of a semiconductor device between G and G' as is also illustrated in FIG. 2A. The cross-sectional view is taken so as to intersect two parallel field plate trenches 209₁ and 209₂. Mesas 229 are defined between the first and second field plate trenches 209₁, 209₂, and the body region 240 is disposed in the mesas 229. The field plate trenches 209₁, 209₂ may be defined so as to extend to a deeper depth than the body region 240. As a result, a lower surface of the field plate trenches 209₁, 209₂ may be disposed beneath a lower boundary of the body region 240. The drift zone 245 is disposed at the interface between the drain contact portion 255 and the body region 240. A field dielectric layer 212, e.g. silicon oxide or silicon nitride, lines the sidewalls and the bottom side of the field plate trenches 2091, 2092. A conductive layer is filled in the field plate trenches 209₁, 209₂ to form a field plate 215. The field plate 215 may be electrically connected to a source terminal. A source region 230 is formed at the first surface 110 of the mesas 229. In order to improve the avalanche characteristics of the semiconductor device, a portion 231 adjacent to the first surface 110 may not be doped to be of the first conductivity type. For example, this may be accomplished by using a suitable mask when defining the source region 230. Accordingly, some portions of the mesa region may not be provided with a source region 230. As a result, an active transistor may not be formed at this portion 231.

Figure 3F:
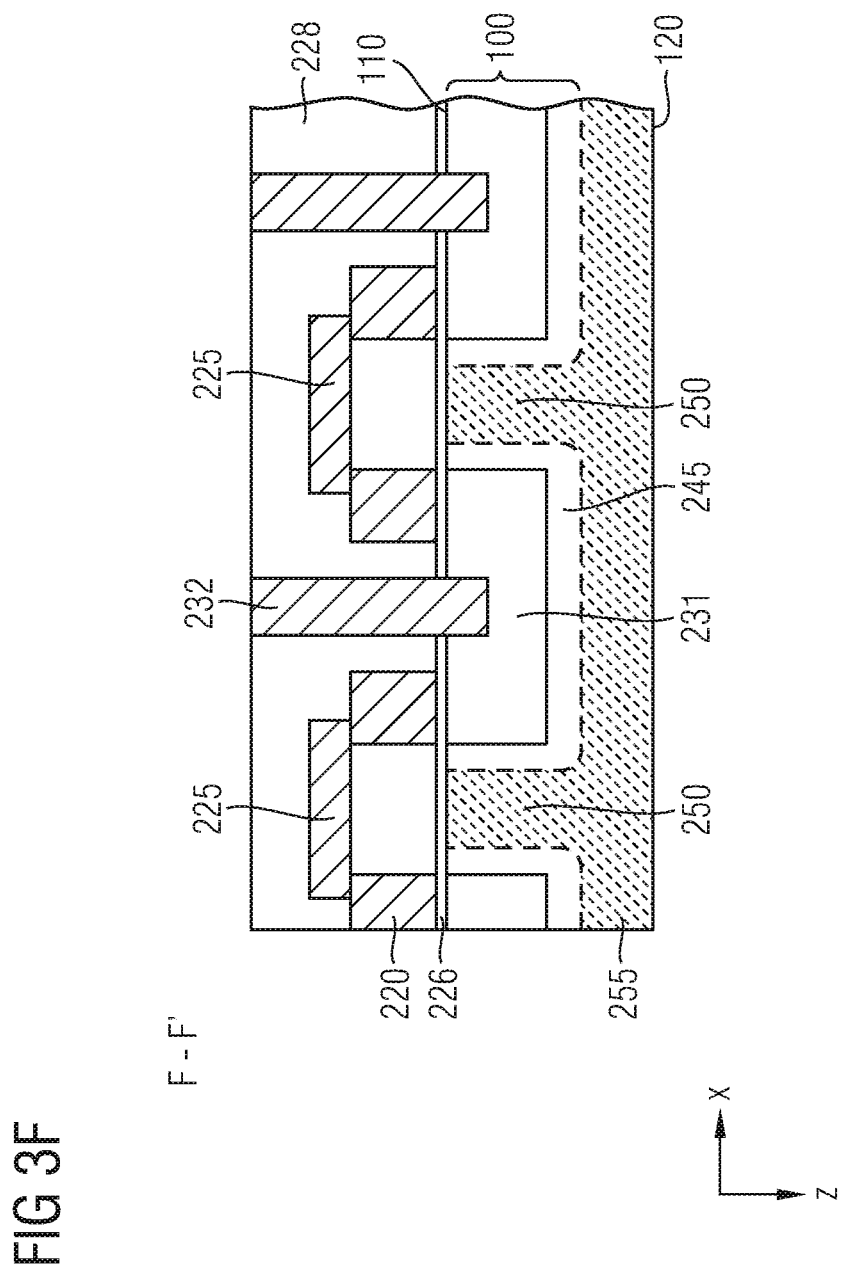

FIG. 3F shows a cross-sectional view between F-F' (cf. FIG. 2A) along the masked portion 231 according to this embodiment. As is illustrated, in the illustrated region along the masked portion, no source region is present in the portion 231 adjacent to the first surface 110.

Figure 4:
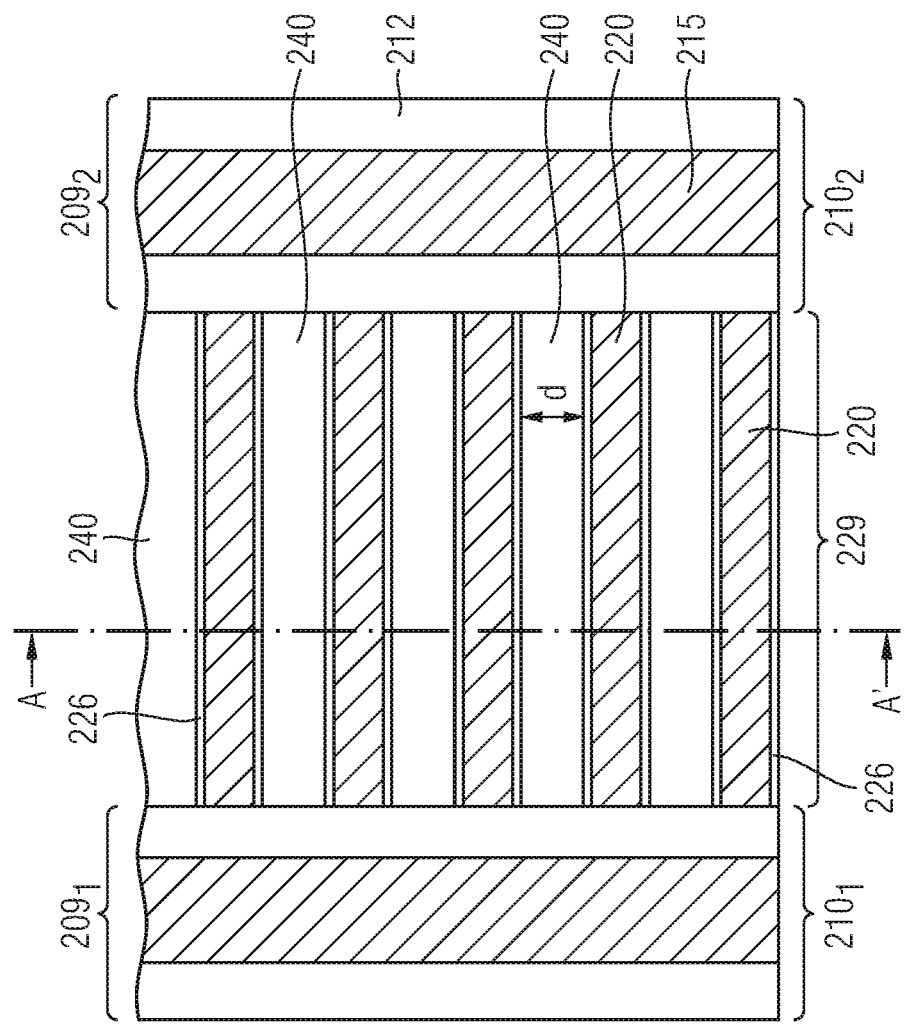
FIG. 4 shows a horizontal cross-sectional view of a semiconductor device according to a further embodiment.

FIG. 4 shows a horizontal cross-section view of a further embodiment. The cross-sectional view of FIG. 4 is taken between I and I' as is illustrated in FIG. 5A, for example. The semiconductor device comprises a field effect transistor, and the field effect transistor comprises first and second field plate structures $210_1$, $210_2$ extending in a first direction (e.g. the x direction). The field plate structures $210_1$, $210_2$ are arranged in first and second field plate trenches $209_1$, $209_2$. The transistor further comprises gate electrode structures 220 and body regions 240 that extend between the first and the second field plate trenches $209_1$, $209_2$. The gate electrode structures 220 and the body regions 240 are arranged in an alternating manner along the first direction. To be more specific, a gate electrode 220 is followed by a body region 240 which is followed by a gate electrode 220 and so on. The gate electrode structures 220 may be connected via a gate contact line that extends in the first direction. A gate dielectric layer 226 may be disposed between the gate electrode 220 and the body region 240. Mesas 229 are defined between adjacent field late trenches $209_1$, $209_2$.

FIG. 5A shows a cross-sectional view of the semiconductor device along the first direction between A-A' as is indicated in FIG. 4. As is illustrated, thin slices of the body region 240 are disposed between adjacent gate electrodes 220. Source regions 230 are disposed on top) of the body regions. Differently stated, the body regions 40 are formed so as to fill the space between adjacent gate electrodes 220 which are formed as thin lamellas. A drain contact portion 255 is disposed adjacent to a second surface 120 of the semiconductor substrate 100. The gate electrodes 220 are connected via a gate contact line 225 to a gate terminal 237. A drift region 245 is disposed adjacent to the first surface 110 of the semiconductor substrate 100. The drift region 245 forms part of the drain contact portion 255. The drift region 245 is disposed adjacent to the body region 240. The cross-sectional view of FIG. 5A taken between adjacent field plate trenches.

According to an embodiment, manufacturing the semiconductor device illustrated in FIG. 5A may comprise forming the gate electrode structures on top of the first surface 110 of a semiconductor substrate 100, forming a gate insulating layer as is common and thereafter performing a selective epitaxy method for forming the body regions 240. The epitaxially grown semiconductor material and the semiconductor substrate 100 constitute a semiconductor body 1000 comprising a first main surface 1100 and a second main surface 120. The second main surface of the semiconductor body may correspond to the second main surface 120 of the semiconductor substrate 100. Thereafter, a doping process may be performed to define the source regions 230. As a result, the body regions 240 and the source regions 230 are formed in the epitaxially grown semiconductor material.

According to the width d of the body region 240 fulfills the following relationship: d1≤2*$l_d$, wherein $l_d$ denotes a length of a depletion zone which is formed at the interface between the gate dielectric layer 226 and the channel region 240. For example, the width of the depletion zone may be determined as:

$$l_d = \sqrt{\frac{4\varepsilon_s kT\ln(N_A/n_i)}{q^2 N_A}}$$

wherein $\varepsilon_s$ denotes the permittivity of the semiconductor material (11.9×$\varepsilon_0$ for silicon, $\varepsilon_0$=8.85×10$^{-14}$ F/cm), k denotes the Boltzmann constant (1.38066×10$^{-23}$ J/k), T denotes the temperature (e.g. 27° C.), ln the denotes the natural logarithm, $N_A$ denotes the impurity concentration of the semiconductor body, $n_i$ denotes the intrinsic carrier concentration (1.45×10$^{10}$ cm$^{-3}$ for silicon at 27° C.), and q denotes the elementary charge (1.6×10$^{-19}$ C). According to the embodiment in which the width d1≤2*$l_d$, the transistor 200 is a so-called "fully-depleted" transistor in which the body region 240 is fully depleted when the gate electrode 220 is set to an on-voltage. In such a transistor, an optimal sub-threshold voltage may be achieved and short channel effects may be efficiently suppressed, resulting in improved device characteristics.

Figure 6:
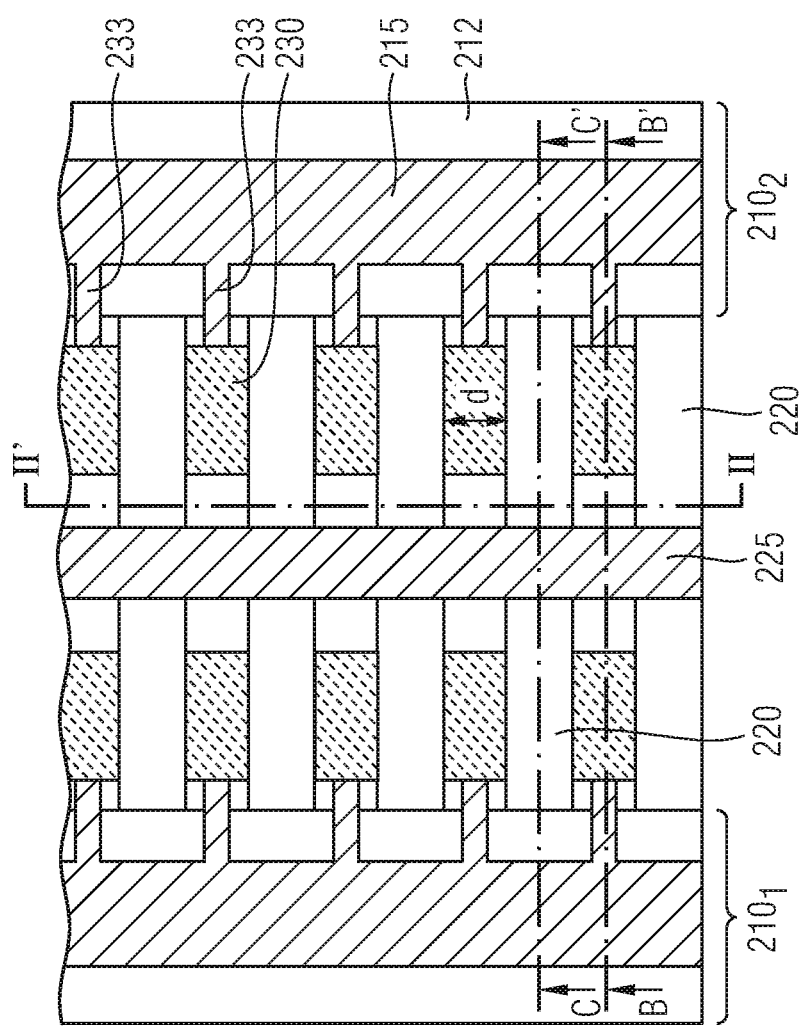
FIG. 6 shows a plan view of a semiconductor device according to a further embodiment.

FIG. 5B shows a cross-sectional view which is taken between C-C' as is also indicated in FIG. 6. The cross-sectional view of FIG. 5B is taken along the y direction. Although. FIG. 6 only shows two field plate trenches and two field plate structures $210_1$, $210_2$, it is clearly to be understood that the pattern illustrated in FIG. 6 is repeated on the right-hand side of the second field plate structure $210_2$ and on the left-hand side of the first plate structure $210_1$. The cross-sectional view of FIG. 5B is taken along a gate electrode 220 to intersect a plurality of field plate trenches $209_1$, . . . , $209_4$. As is shown, the field plates 210 are arranged in several trenches $209_1$, . . . . $209_4$. The drift zone 245 which is doped with a first conductivity type is disposed adjacent to the first surface 110. Due to the specific construction, according to which the field plate trenches $209_1$, . . . $209_4$ are formed in the semiconductor substrate 100, whereas the body region 240 is defined in epitaxially grown semiconductor material, the field plate trenches $209_1$, . . . $209_4$ extend to a deeper depth than the body region FIG. 5C shows a cross-sectional view which is taken between B-B' as also indicated in FIG. 6. The cross-sectional view of FIG. 5C is taken along the second direction along a plurality of body regions. The body regions are disposed between adjacent field plate structures. A source region 230 of the first conductivity type is disposed at a surface of the body regions 240. The body region is doped with the second conductivity type. The source region 230 and the body regions 240 are electrically connected to the source terminal via a source contact line 232. As is also illustrated in FIG. 5C, the field plate 215 is electrically connected to the source terminal via the source contact line 232.

FIG. 5D shows a cross-sectional view of the semiconductor device between II and II' as is indicated in FIG. 6. The cross-sectional view of FIG. 5D is similar to the cross-sectional view of FIG. 5A. Differing from the embodiment of FIG. 5A, the source region 230 is not formed in a central portion of the mesa. Thereby, the avalanche breakdown characteristics may be improved.

The semiconductor device described in FIG. 4 and 5A to 5D implements a vertical transistor 200. The source region 230 is disposed at a first horizontal surface 1100 of the semiconductor body 1000 and the drain contact region 255 is disposed adjacent to a second surface 120 of the semiconductor body 1000. When a suitable voltage is applied to the gate electrode 220, conductive inversion channel is formed adjacent to the gate electrode 220. In particular, the conductive inversion channel vertically extends along the gate electrode. Accordingly, a current that vertically flows may be controlled by the gate electrode. Further, a first and a second load terminal may be connected to opposite sides of the semiconductor substrate. The transistor 200 may implement a fully-depleted transistor in which the body region 240 is fully depleted when the gate electrode 220 is set to an on-voltage.

Since the gate electrode 220 and the body region of the semiconductor device described in FIGS. 4 and 5A to 5D are formed over the first surface 110 of a semiconductor substrate 100 to form a semiconductor body 1000, the gate-drain overlap may be exactly set. As a result, the characteristics or the transistor are further improved. Moreover, due to the presence of the field plate structures 2101, 2012 compensation of the charge carriers in the drift zone 245 is accomplished. Since the field plates 215 are disposed in field plate trenches, charge compensation may be accomplished along the depth of the drift zone 245. As a consequence, the doping concentration of the body region 240 may be increased without deteriorating the blocking characteristics of the transistor, thereby reducing the on-state resistance (RonxA) of the transistor. Since the gate electrode is formed over the first surface 110 after forming the field plate trenches, a bottom side of the gate electrode structure is disposed above a top side of the conductive material of the field plate structure.

FIG. 6 shows an example of a layout of the semiconductor device. The plan view of FIG. 6 is similar to the cross-sectional view of FIG. 4. Differing from the cross-sectional view of FIG. 4, source regions 230 are illustrated at the main surface. Further, specific surface portions 231 may not be doped so as to form source regions. Further, the semiconductor device may further comprise body contacts 233 electrically coupling the body region to a source terminal. The body contacts 233 are arranged in a portion of the body regions adjacent to the field plate.

Figure 7A:
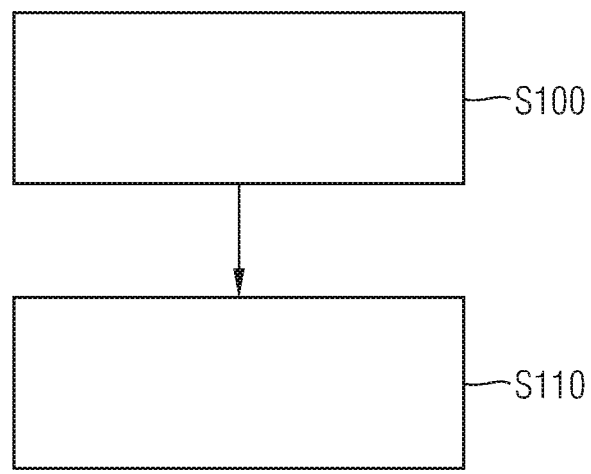
FIGS. 7A and 7B illustrate methods according to embodiments.

FIG. 7A shows an example of a method of manufacturing a semiconductor device according to an embodiment. As is illustrated in FIG. 7A, a method of manufacturing a semiconductor de vice comprising a field effect transistor in a semiconductor substrate having a first surface comprises forming first and second field plate structures (S100) extending in a first direction parallel to the first surface, the field plate structures being arranged in first and second field plate trenches formed in the first surface. The method further comprises forming gate electrode structures and body regions (S110) so as to extend between the first and second field plate trenches, wherein the gate electrode structures and the body regions are formed to be arranged in an alternating manner along the first direction.

Figure 7B:
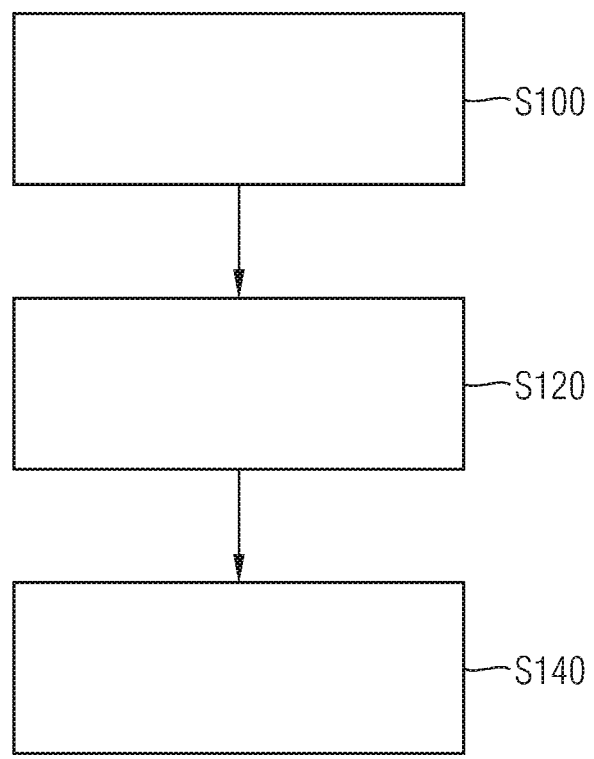

According to the embodiment of FIG. 7B, forming the gate electrode (S120) is performed before forming the body regions (S140). For example, the body regions may be formed by selective epitaxy after forming the gate electrode structures.

According to the embodiment illustrated in FIGS. 4 to 6, a semiconductor device implements a vertical transistor. Due to the fact that gate electrode structures and body regions are disposed so as to alternate between adjacent field plate trenches, the gate-drain overlap may be exactly adjusted. As a consequence, the performance of the device may be improved while improving the gate drain capacitance and forming a field plate. According to the embodiment illustrated in FIGS. 1 to 6, the width of the gate electrodes may be about 30 to 70 nm, e.g. 50 nm. The distance between adjacent gate electrodes may be 80 to 150 nm, e.g. 100 nm. A distance between adjacent field plate trenches may be 300 to 800 nm, e.g. 400 to 600 nm, e.g. 500 nm.

Figure 8:
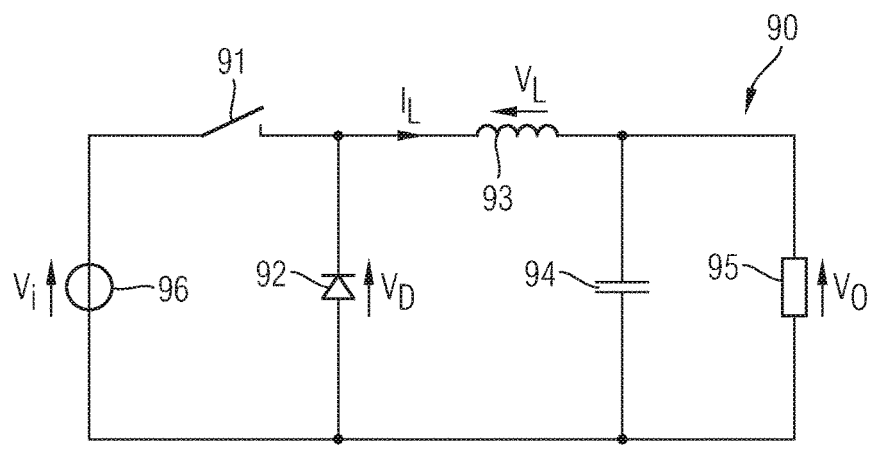
FIG. 8 illustrates an example of a converter circuit including the semiconductor device.

For example, the semiconductor device according to an embodiment may be a component of an electric circuit such as a buck converter. FIG. 8 shows an example of an equivalent circuit diagram of a buck converter 90 that may comprise the semiconductor device according to an embodiment. As is shown, a buck converter according to an embodiment may comprise a voltage supply 96, a switch 91, an inductor 93, a capacitance 94, a load 95, and a diode 92. The switch 91 may comprise the semiconductor device as described hereinabove. For example, the buck converter 90 may convert an input voltage of about 12 V to about 1 to 2 Volts at a frequency larger than 1 MHz. The buck converter 90 may for example be applied in devices such as power supplies, e.g. a switched mode power supply.

While embodiments of the invention have been described above, it is obvious that further embodiments may be implemented. For example, further embodiments may comprise any sub-combination of features recited in the claims or any sub-combination of elements described is the examples given above. Accordingly, this spirit and scope of the appended claims should not be limited to the description of the embodiments contained herein.

What is claimed is:

1. A semiconductor device, comprising:
a semiconductor substrate having a first surface;
first and second field plate structures extending in a first direction parallel to the first surface;
a plurality of gate electrode structures disposed over the first surface and extending in a second direction parallel to the first surface, the second direction being different than the first direction;
a plurality of source regions and drain regions of a first conductivity type arranged in an alternating manner at the first surface so that a drain region is disposed on one side of a gate electrode structure and a source region is disposed on the other side of the gate electrode structure;
a plurality of body regions of a second conductivity type opposite the first conductivity type;
a drift zone disposed between the body regions and the drain regions; and
a drain contact portion at a second surface of the semiconductor substrate opposite the first surface,
wherein the gate electrode structures are disposed between the first and the second field plate structures,
wherein the source regions and the drain regions extend in parallel with one another along the second direction,
wherein the source regions are formed in the body regions,
wherein the body regions extend in parallel with the source regions and the drain regions along the second direction.

2. The semiconductor device of claim 1, wherein a portion of the drift zone is disposed between the body regions and the drain contact portion.

3. The semiconductor device of claim 1, wherein the first field plate structure is disposed in a first field plate trench in the first surface, and wherein the second field plate structure is disposed in a second field plate trench in the first surface.

4. The semiconductor device of claim 3, wherein semiconductor mesas are defined between the first and the second field plate trenches.

5. The semiconductor device of claim 4, wherein some portions of the semiconductor mesas adjacent to the first surface are not doped of the first conductivity type so that these portions of the semiconductor mesas are devoid of a source region.

6. The semiconductor device of claim 1, further comprising:
source contact lines for connecting the first and the second field plate structures to a source terminal, the source contact lines extending in the second direction; and
gate contact lines for connecting the gate electrode structures to a gate terminal, the gate contact lines extending in the second direction.

7. The semiconductor device of claim 1, further comprising:
source contact lines for connecting the first and the second field plate structures to a source terminal, the source contact lines extending in the first direction; and
gate contact lines for connecting the gate electrode structures to a gate terminal, the gate contact lines extending in the first direction.

8. An electric circuit comprising the semiconductor device of claim 1.

9. The electric circuit of claim 8, wherein the electric circuit is a buck converter.

10. A power supply comprising the electric circuit of claim 8.

11. A semiconductor device, comprising:
a semiconductor substrate having a first surface and a second surface opposite the first surface;
first and second field plate structures extending in a first direction parallel to the first surface;
a plurality of gate electrode trench structures extending in a second direction parallel to the first surface, the second direction being different than the first direction;
a body region of a second conductivity type extending between the first and second field plate structures;
a source region of a first conductivity type opposite the second conductivity type formed in the body region and extending between the first and second field plate structures,
wherein the gate electrode trench structures are disposed between the first and the second field plate structures,
wherein the gate electrode trench structures extend through the source region and into the body region,
wherein slices of the body region are disposed between adjacent ones of the gate electrode trench structures.

12. The semiconductor device of claim 11, wherein the source region is at the first surface and a drain region of the first conductivity type is at the second surface.

13. The semiconductor device of claim 11, wherein a width d of the body region is defined by d≤2×ld, wherein ld denotes a length of a depletion zone formed at an interface between the body region and the gate electrode trench structures, and wherein the width is measured along the first direction.

14. The semiconductor device of claim 11, further comprising body contacts configured to electrically connect the body region to a source terminal, the body contacts being arranged in a portion of the body region adjacent to the first and the second field plate structures.

15. The semiconductor device of claim 11, further comprising an epitaxial layer on the first surface of the semiconductor substrate, wherein the body region and the source region are formed in the epitaxial layer.

16. The semiconductor device of claim 15, wherein the gate electrode trench structures are formed in the epitaxial layer and terminate prior to the first surface of the semiconductor substrate.

17. The semiconductor device of claim 15, wherein the first and second field plate structures extend through the epitaxial layer and into a drain contact region formed in the semiconductor substrate below the body region.

18. A semiconductor device, comprising:
a semiconductor substrate having a first surface;
first and second field plate structures extending in a first direction parallel to the first surface;
a plurality of gate electrode structures disposed over the first surface and extending in a second direction parallel to the first surface, the second direction being different than the first direction;
a plurality of source regions and drain regions of a first conductivity type arranged in an alternating manner at the first surface so that a drain region is disposed on one side of a gate electrode structure and a source region is disposed on the other side of the gate electrode structure;
source contact lines for connecting the first and the second field plate structures to a source terminal, the source contact lines extending in the second direction; and
gate contact lines for connecting the gate electrode structures to a gate terminal, the gate contact lines extending in the second direction,
wherein the gate electrode structures are disposed between the first and the second field plate structures,
wherein the source regions and the drain regions extend in parallel with one another along the second direction.

19. A semiconductor device, comprising:
a semiconductor substrate having a first surface;
first and second field plate structures extending in a first direction parallel to the first surface;
a plurality of gate electrode structures disposed over the first surface and extending in a second direction parallel to the first surface, the second direction being different than the first direction;
a plurality of source regions and drain regions of a first conductivity type arranged in an alternating manner at the first surface so that a drain region is disposed on one side of a gate electrode structure and a source region is disposed on the other side of the gate electrode structure;
source contact lines for connecting the first and the second field plate structures to a source terminal, the source contact lines extending in the first direction; and
gate contact lines for connecting the gate electrode structures to a gate terminal, the gate contact lines extending in the first direction,
wherein the gate electrode structures are disposed between the first and the second field plate structures,
wherein the source regions and the drain regions extend in parallel with one another along the second direction.

* * * * *